United States Patent
Magee et al.

(10) Patent No.: US 9,324,409 B1
(45) Date of Patent: Apr. 26, 2016

(54) METHOD AND APPARATUS FOR GATING A STROBE SIGNAL FROM A MEMORY AND SUBSEQUENT TRACKING OF THE STROBE SIGNAL OVER TIME

(71) Applicant: Xilinx, Inc., San Jose, CA (US)

(72) Inventors: Terence J. Magee, San Francisco, CA (US); Jayant Mittal, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/534,493

(22) Filed: Nov. 6, 2014

(51) Int. Cl.
*G11C 8/16* (2006.01)
*G11C 11/409* (2006.01)

(52) U.S. Cl.
CPC ................................ *G11C 11/409* (2013.01)

(58) Field of Classification Search
CPC ........ G11C 8/17; G11C 7/1072; G11C 7/222; G11C 7/225
USPC ................ 365/233.13, 233.1, 230.01, 233.17
See application file for complete search history.

(56) References Cited

U.S. PATENT DOCUMENTS

| | | | | |
|---|---|---|---|---|
| 7,218,557 B1 * | 5/2007 | Chlipala | ............. | G06F 13/1689 365/189.07 |
| 2006/0055441 A1 * | 3/2006 | McClannahan | ...... | G11C 7/1066 327/158 |
| 2008/0005518 A1 * | 1/2008 | Gillingham | ......... | G06F 13/4243 711/167 |
| 2011/0249522 A1 * | 10/2011 | Welker | .................. | G11C 29/02 365/194 |

* cited by examiner

*Primary Examiner* — Han Yang
(74) *Attorney, Agent, or Firm* — Kin-Wah Tong

(57) ABSTRACT

A method, non-transitory computer readable medium and circuit for gating a strobe (DQS) signal are disclosed. The method sends a read command to a memory, sends a strobe clock signal after the read command is sent and before the DQS signal is received from the memory, wherein the strobe clock signal comprises a duration equal to a duration of the DQS signal, gates the DQS signal based on the strobe clock signal to generate a positively gated strobe signal for indicating a rising edge of the DQS signal, wherein the gating is performed during a pre-amble of the DQS signal and generates a negatively gated strobe signal based on the positively gated strobe signal for indicating a falling edge of the DQS signal.

20 Claims, 5 Drawing Sheets

METHOD AND APPARATUS FOR GATING A STROBE SIGNAL FROM A MEMORY AND SUBSEQUENT TRACKING OF THE STROBE SIGNAL OVER TIME

FIELD OF THE INVENTION

The present disclosure relates to the field of source synchronous memories, e.g., DDR3 and DDR4 synchronous dynamic random-access memory (SDRAM) and, more particularly, to a method and apparatus for gating a strobe signal from a memory and subsequent tracking of the strobe signal over time.

BACKGROUND OF THE INVENTION

In the control of synchronous dynamic random access memory (SDRAM), the memory controller must identify when a strobe (DQS) signal is associated with read data (DQ) signal and allow the passage of the DQS data sampling edges into the memory controller to successfully sample the associated DQ signal. In all other cases, the memory controller must block all transitions on the DQS signal from entering the memory controller.

Prior solutions for SDRAM such as DDR3 SDRAM use a gate signal that passes the DQS signal when asserted and blocks the DQS signal when de-asserted. The gate signal is a decode of a controller read command that is extended to match the duration of the DQS signal and delayed with a programmable delay to occur when the DQS signal enters the memory controller. The gate signal asserts during the lower portion of DQS pre-amble and de-asserts during the low portion of DQS post-amble. In the case of DDR3 SDRAM, the placement of such a gate signal within a very small timing window has very little margin for error. This small margin is reduced by degradation to the gate signal that may occur as a result of jitter and duty cycle distortion (DCD) as the gate signal passes through decode and delay circuits. At the same time, jitter and DCD can also occur on the DQS signal to further reduce this small margin. In addition, the gate signal is turned on and off by separate signals resulting in additional complications with timing of the gate signal.

Furthermore, the DQS pre-amble for DDR3 SDRAM is different from the more recent DDR4 SDRAM in that the duration of the pre-amble's low period is approximately half a memory clock period (tCK) compared to one tCK for DDR3. It is extremely challenging to position the gate signal within the low period of the pre-amble at the DDR4 data rates. No known solution exists to address this problem.

Finally, the arrival time of the DQS signal relative to the gate signal may vary over time. This is due to variation in the launch time of the DQS signal from the SDRAM as well as the effect of Voltage-Temperature (VT) variation in the system. Prior solutions required re-training the gate signal periodically to its optimal position by putting the memory offline, which can reduce the performance of the system.

SUMMARY OF THE INVENTION

A method for gating a strobe (DQS) signal is disclosed. One embodiment of the method includes sending, by a memory controller, a read command to a memory, and sending, by the memory controller, a strobe clock signal after the read command is sent and before the DQS signal is received from the memory, wherein the strobe clock signal comprises a duration equal to a duration of the DQS signal. The memory controller gates the DQS signal based on the strobe clock signal to generate a positively gated strobe signal indicating a rising edge of the DQS signal, wherein the gating is performed during a pre-amble of the DQS signal. The memory controller generates a negatively gated strobe signal based on the positively gated strobe signal for indicating a falling edge of the DQS signal.

According to another embodiment, a non-transitory computer-readable medium storing a plurality of instructions which, when executed by a memory controller, cause the memory controller to perform operations for gating a strobe (DQS) signal is provided. The operations of the non-transitory computer readable medium include sending a read command to a memory, and sending a strobe clock signal after the read command is sent and before the DQS signal is received from the memory, wherein the strobe clock signal comprises a duration equal to a duration of the DQS signal. The operations further include gating the DQS signal based on the strobe clock signal to generate a positively gated strobe signal for indicating a rising edge of the DQS signal, wherein the gating is performed during a pre-amble of the DQS signal and generating a negatively gated strobe signal based on the positively gated strobe signal indicating a falling edge of the DQS signal.

According to another embodiment, a circuit for gating a strobe (DQS) signal is provided. The circuit includes a clock generator circuit for sending a strobe clock signal, and a gating circuit. The gating circuit comprises a pgate circuit and an ngate circuit. The pgate circuit is for gating the DQS signal based on the strobe clock signal to generate a positively gated strobe signal indicating a rising edge of the DQS signal, wherein the gating is performed during a pre-amble of the DQS signal. The ngate circuit is for generating a negatively gated strobe signal based on the positively gated strobe signal indicating a falling edge of the DQS signal.

Other features will be recognized from consideration of the detailed description and the claims.

BRIEF DESCRIPTION OF THE DRAWINGS

Accompanying drawings show exemplary embodiments in accordance with one or more aspects of the disclosure; however, the accompanying drawings should not be taken to limit the disclosure to the embodiments shown, but are for explanation and understanding only.

To facilitate understanding, identical reference numerals have been used, where possible, to designate identical elements that are common to the figures.

DETAILED DESCRIPTION OF THE DRAWINGS

The present disclosure broadly discloses a method, non-transitory computer readable medium and a circuit for gating a strobe signal. As discussed above, in the control of SDRAM, the memory controller must identify when the DQS signal is associated with the DQ signal and the memory controller must pass the DQS' data sampling edges into the memory controller to successfully sample the associated DQ signal. In all other cases, the memory controller must block all transitions on the DQS signal from entering the memory controller.

Previous methods were specific to a particular type of DRAM and provided a very small margin of error that was even further reduced by delay and jitter. In addition, the arrival time of the DQS signal relative to the gate signal in prior approaches may vary over time due to VT variation. As a result, the prior solutions required periodic re-training of the gate signal to its optimal position. However, the re-training process requires the memory to be off-line, which can reduce the performance of the system.

One embodiment of the present disclosure provides a method for gating the DQS signal that can be applied to memories that have different pre-ambles (e.g., DDR3 SDRAM and DDR4 SDRAM containing a high to low transition in the pre-amble) and automatically ending the gating process after gating of the DQS signal is completed. In addition, the method does not require re-training. As a result, the circuits and methods disclosed herein are not memory type specific and can be used for both DDR3 SDRAM and DDR4 SDRAM that have different pre-ambles. In addition, the gating circuit can be monitored over time and adjusted automatically to account for any VT variation without the need to put the memory off-line for re-training the gating circuit.

Figure 1:
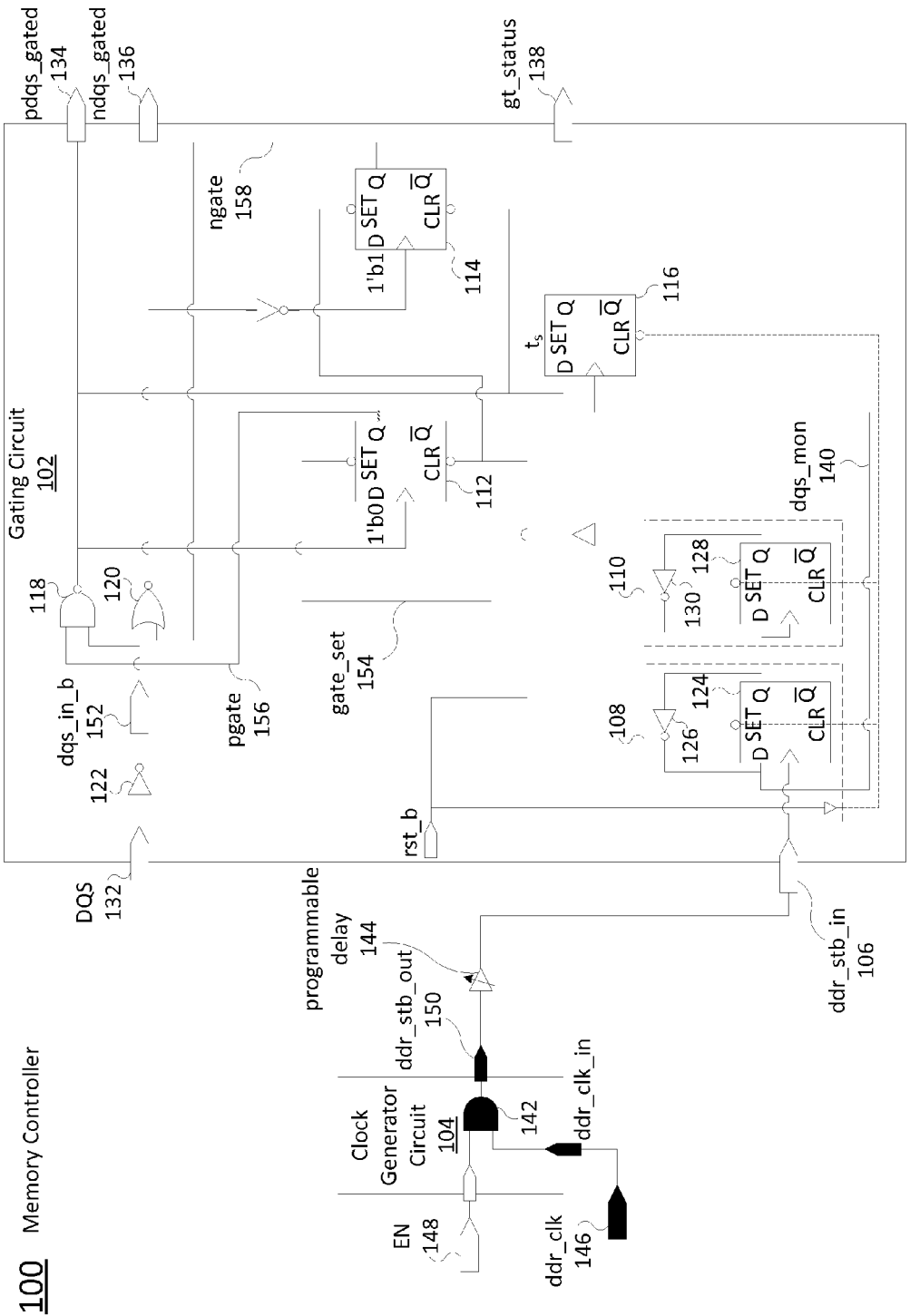
FIG. 1 illustrates an example circuit for gating a strobe (DQS) signal and tracking the strobe signal over time.

FIG. 1 illustrates an example circuit 100 (e.g., implemented in part or in whole within a memory controller) to implement methods described herein. In one embodiment, the circuit 100 comprises a gating circuit 102 (broadly a circuit) and a clock generator circuit 104. In one embodiment, the clock generator circuit 104 comprises a memory clock signal 146 labeled "ddr_clk" that is fed as an input "ddr_clk_in" to an AND gate 142. An enable signal 148 labeled "EN" is also fed as an input to the AND gate 142.

The AND gate 142 may be gated on and off to generate a strobe clock signal 150 labeled "ddr_stb_out" that is fed as a strobe clock input signal 106 labeled "ddr_stb_in" for the gating circuit 102. In one embodiment, the strobe clock signal 150 may be delayed for a period between 0 degrees and 90 degrees via a programmable delay 144. In one embodiment, the degrees may be associated with an amount of time based on a speed of the memory that is being used and a clock cycle of the memory. For example, 90 degrees may be one quarter of a memory clock cycle. Thus, if a 2.667 Gigabits per second (Gbps) SDRAM memory is being used, the clock period would be approximately 750 picoseconds (ps) and a 90 degree delay would be approximately 187.5 ps.

In one embodiment, a duration or a length of time of the strobe clock signal 150 may be a function of a speed of the memory. For example, the duration of the strobe clock signal 150 may be long enough to allow all data to be read or written. Said another way, the duration of the strobe clock signal 150 may be equal to a duration of a DQS signal 132 (also labeled "DQS") less the pre-amble of the DQS signal 132.

In one embodiment, the enable signal 148 may be delayed through a series of one or more periodic delays (not shown) in combination with the programmable delay 144 such that the strobe clock input signal 106 is properly timed with respect to the DQS signal 132. The periodic delays may be implemented as a series of one or more periodic delays, e.g., periodic delays of 90 degrees, 180 degrees, 270 degrees, 720 degrees, and the like.

In one embodiment, the gating circuit 102 is designed to allow the DQS signal 132 to be gated automatically during a pre-amble, regardless of whether the pre-amble is for DDR3 SDRAM or DDR4 SDRAM. In addition, the gating circuit 102 automatically closes itself after the last falling edge is read. In other words, no timing issues arise due to attempting to manually close the gating circuit (or closing a relevant portion of the gating circuit, e.g., a pgate circuit and an ngate circuit as discussed below) as done in prior methods and circuits. Furthermore, the gating circuit 102 is designed to monitor the drift of the arrival time of the DQS signal 132 relative to the arrival time of the strobe clock input signal 106 over time due to VT variation and to automatically adjust the strobe clock input signal 106 using the programmable delay 144 in response to the drift.

In one embodiment, the gating circuit 102 comprises a first divider circuit 108 and a second divider circuit 110. In one embodiment, the first divider circuit 108 comprises a first flip flop 124 and an inverter 126. The first divider circuit 108 may be used to divide a frequency of the strobe clock input signal 106 (e.g., by one half) to generate a monitor signal 140 labeled "dqs_mon" that is fed to a monitor flip flop 116. As discussed in further detail below, the monitor signal 140 will be used to determine whether drift has occurred. The first divider circuit 108 and the monitor flip flop 116 can be referred to as the gate monitor circuit.

In one embodiment, the second divider circuit 110 comprises a second flip flop 128 and an inverter 130. In one embodiment, the second divider circuit 110 may further divide the frequency of the strobe clock input signal 106 (e.g., by another one half) to generate a gate set signal 154 labeled "gate_set." The gate set signal 154 is then fed to a positive gate (pgate) flip flop 112. The pgate flip flop 112 receives the gate set signal 154 and generates a pgate signal 156 labeled "pgate." The pgate signal 156 is fed to a NAND gate 118. In one embodiment, the pgate flip flop 112 and the NAND gate 118 may also be referred to collectively as the pgate circuit.

In one embodiment, the NAND gate 118 may also receive an inverted DQS signal 152 labeled "dqs_in_b." The inverted DQS signal 152 may also be generally referred to as an inverted strobe signal. The inverted DQS signal 152 may be generated by inverting the DQS signal 132 via an inverter 122. The inverted DQS signal 152 and the pgate signal 156 may be fed to the NAND gate 118 to generate the pdqs_gated signal 134.

In one embodiment, a positively gated strobe (pdqs_gated) signal 134 labeled "pdqs_gated" is used to indicate a rising edge of the DQS signal 132. As discussed above, the pdqs_gated signal 134 can be sampled and compared against the monitor signal 140 to generate a gate status signal 138 labeled "gt_status." The status signal 138 will indicate whether the strobe clock input signal 106 is early or late relative to the DQS signal 132.

The pdqs_gated signal 134 may be sampled by the monitoring flip flop 116 as discussed above. The pdqs_gated signal 134 may also be fed to a negative gate (ngate) flip flop 114. The ngate flip flop 114 may then generate an ngate signal 158 in response to receiving the pdqs_gated signal 134. The ngate signal 158 may then be sent to an NOR gate 120. In one embodiment, the ngate flip flop 114 and the NOR gate 120 may be referred to collectively as the ngate circuit.

In one embodiment, the NOR gate 120 may also receive the inverted DQS signal 152. The inverted DQS signal 152 and the ngate signal 158 may be fed to the NOR gate 120 to generate a negatively gated strobe (ndqs_gated) signal 136 that is used to indicate a falling edge of the DQS signal 132. In one embodiment, the pdqs_gated signal 134 and the ndqs_gated signal 136 may be fed back into the respective pgate flip flop 112 and ngate flip flop 114 to close the pgate flip flop 112 and the ngate flip flop 114. The pgate flip flop 112 will de-assert the pgate signal 156 in response to the last rising edge of the pdqs_gated signal 134 before a post-amble of the DQS signal 132 based on a known length or duration of the DQS signal 132 and the ngate flip flop 114 will de-assert the ngate signal 158 signal in response to the last falling edge of the ndqs_gated signal 136 before the post-amble of the DQS signal 132 based on a known length or duration of the DQS signal 132. In other words, the pgate signal 156 is automatically de-asserted (closed) after the last rising edge of the DQS signal 132 prior to its post-amble and the ngate signal 158 is automatically de-asserted (closed) after the last falling edge of the DQS signal 132 prior to its post-amble. In other words, the duration of the ddr_stb_in signal 106 matches the duration of the DQS signal (less its preamble). If the ddr_stb_in signal 106 is placed such that the gate_set signal 154 first asserts in the center of the pre-amble, then it is guaranteed (by the ddr_stb_in signal duration) that the gate_set signal 154 will always be de-asserted (1) before the last rising edge of the DQS signal. If the gate_set signal 154 is de-asserted when last the rising edge of the DQS signal passes through NAND gate 118, then its edge (pdqs_gated) will clock the positive gate flip flop 112 forcing pgate low and closing the gate, or until a new ddr_stb_out signal 150 comes along.

It should be noted that FIG. 1 illustrates only an example configuration of the gating circuit 102 and the clock generator circuit 104. Notably, other configurations that achieve the same functions described herein may be within the scope of the present disclosure.

Figure 2:
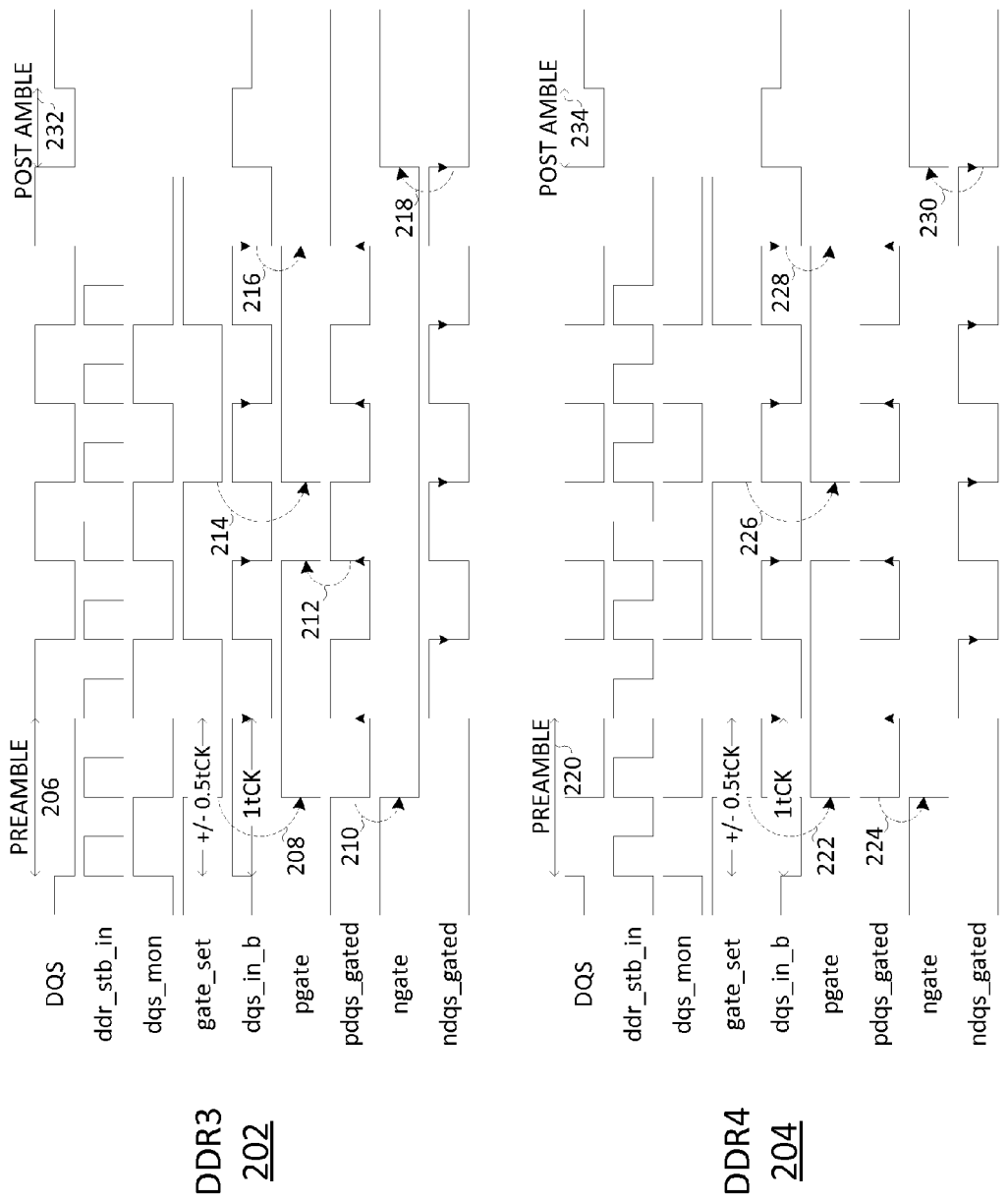
FIG. 2 illustrates a timing diagram of the gating for DDR3 SDRAM and DDR4 SDRAM.

FIG. 2 illustrates an example timing diagram or waveform 202 of the gating of a DDR3 SDRAM and an example timing diagram or waveform 204 of the gating of a DDR4 SDRAM. While discussing FIG. 2, reference to the signals in FIG. 1 may be made concurrently with discussion of FIG. 2. The waveform 202 of FIG. 2 illustrates a relationship of various signals illustrated in FIG. 1 including the DQS signal (e.g., the DQS signal 132), ddr_stb_in (e.g., the strobe clock signal 106), dqs_mon (e.g., the monitor signal 140 generated by the first divider circuit 108), gate_set (e.g., the gate set signal 154 generated by the second divider circuit 110), dqs_in_b (e.g., the inverted DQS signal 152), pgate (e.g., the pgate signal 156 generated by the pgate flip flop 112), pdqs_gated (e.g., the pdqs_gated signal 134 generated by the pgate circuit to indicate the rising edges of the DQS signal 132), ngate (e.g., the ngate signal 158 generated by the ngate flip flop 114), and ndqs_gated (e.g., the ndqs_gated signal 136 generated by the ngate circuit to indicate the falling edges of the DQS signal 132).

Referring to the waveform 202 for DDR3 SDRAM, the DQS signal 132 is illustrated with a pre-amble 206. The pre-amble 206 for the DDR3 SDRAM has a low period that is equal to one memory clock period. As illustrated by the waveform 202, the clock strobe input signal 106, also referred to as "ddr_stb_in" in the waveform 202 is illustrated as being aligned with the DQS signal 132. The timing of the gate_set signal 154 is initially set such that the gate_set signal 154 is switched to a low state (or a value of 0) in the middle of the pre-amble 206 of the DQS signal 132 and the corresponding dqs_in_b signal 152.

When the gate_set signal 154 is switched to the low state, the pgate signal 156 is switched to a high state (or a value of 1) as illustrated by dashed lines 208. For example, whenever the gate_set is in a high state and the dqs_in_b is on a falling edge, the pgate may be triggered to go to a low state. Otherwise, the pgate may be triggered to go to and stay in a high state until the next time the gate_set is in a high state and the dqs_in_b is on a falling edge. In addition, the pdqs_gated signal 134 is switched to a low state, which switches the ngate signal 158 to a low state as illustrated by dashed line 210. The pdqs_gated signal 134 is triggered between low and high states based on the oscillation of the dqs_in_b and the state of pgate fed into the NAND gate 118.

At a later time, the pdqs_gated signal 134 rises and switches the pgate signal 156 to a low state as illustrated by dashed line 212. This corresponds to a time when the gate_set is in a high state and the dqs_in_b is on a falling edge, as noted above. In other words, the gating circuit 102 closes on every second cycle of rising edge of the DQS signal 132. Then the gate_set signal 154 goes to a low state and the pgate signal 156 rises again to a high state at a later time as illustrated by dashed line 214. In other words, the pgate circuit and the ngate circuit are being effectively turned on and off (e.g., opened and closed) during the DQS signal 132 and remain off (e.g., closed) at the end of the DQS signal 132. The sole job of the pgate circuit is to gate through the positive (e.g., rising) edges of the DQS signal 132 and the sole job of the ngate circuit is to gate through the negative (e.g., falling) edges of the DQS signal 132 outside of the pre-amble and the post-amble without affecting these edges. Thus, the present circuit 100 gates separately through the positive edges and the negative edges of the DQS signal 132. The pgate flip flop 112 is only de-asserted after the pgate circuit has accomplished the job of gating through the pdqs_gated signal 134 and has successfully passed through a rising edge of the DQS signal 132 that de-asserts the pgate flip flop 112. The ngate flip flop 114 is similarly de-asserted.

At the end of the DQS signal 132 and the corresponding dqs_in_b signal 152, the dqs_in_b signal 152 falls to a low state and the pgate signal 156 also falls to a low state closing the pgate circuit permanently until a new burst of a DQS signal 132 arrives, as illustrated by dashed line 216. Notably, the pgate circuit is closed after the last rising or positive edge of the pdqs_gated signal 134 is read.

Subsequently, after the last falling edge of the ndqs_gated signal 136 is read, the ngate circuit is permanently closed until a new burst of a DQS signal 132 arrives. For example, as the last falling edge of the ndqs_gated signal 136 goes to a low state, the ngate signal 158 goes to a high state, thereby closing the ngate circuit, as illustrated by dashed line 218. In addition, both the pgate circuit and the ngate circuit are closed before the post-amble 232.

It should be noted that the DQS signal 132 is always made up of a multiple of four active pulses after pre-amble and before post-amble and this guarantees that the gating circuit 102 will be closed permanently after the last active edge if placement of the ddr_stb_in signal 106 is optimal (e.g., the initial opening of the pgate circuit is within the pre-amble of the DQS signal 132). In addition, the pgate and ngate circuits can close during the DQS signal 132, but always open up again for the next DQS signal pulse.

Notably, embodiments of the present disclosure use the ddr_stb_in signal 106 instead of a constant-level gate for the duration of the DQS signal 132. The benefit is that the gate_set signal 154 can be generated locally in a very small circuit to achieve better margin and remove sensitivity to DCD on the gating circuit 102. Because the only duration information of the DQS signal 132 is in the ddr_stb_in signal 106, the derived gate_set signal 154 has to toggle, which in turn means that any derived gate_set signal may turn on and off during the DQS signal 132.

Referring to the waveform 204 for DDR4 SDRAM, the DQS signal 132 is illustrated with a pre-amble 220 and a post-amble 234. Notably, the pre-amble 220 of the DDR4 SDRAM has a low period that is half the length of the DDR3 SDRAM. As a result, timing the gating of the DQS signal 132 in previous methods was very difficult with a low margin of error in the low period of the DDR4 SDRAM.

Also the falling edge in the middle of the pre-amble 220 of the DDR4 SDRAM would cause interference as sometimes the falling edge would mistakenly be read as the first falling edge of the ndqs_gated signal 136. However, the design of the gating circuit 102 of the present disclosure allows the DQS signal 132 to be properly gated regardless of the pre-amble 206 or pre-amble 220. The DQS signal 132 is split into a separate pdqs_gated signal 134 and a ndqs_gated signal 136 that begins after the pdqs_gated signal 134. As a result, the falling edge of the pre-amble 220 or the pdqs_gated signal 134 that occurs during the pre-amble 220 of the DDR4 SDRAM is not improperly read. Otherwise, the timing of the signals in the waveform 204 is similar in all other respects to the waveform 202 for the DDR3 SDRAM, as illustrated by the dashed lines 222, 224, 226, 228 and 230.

Figure 3:
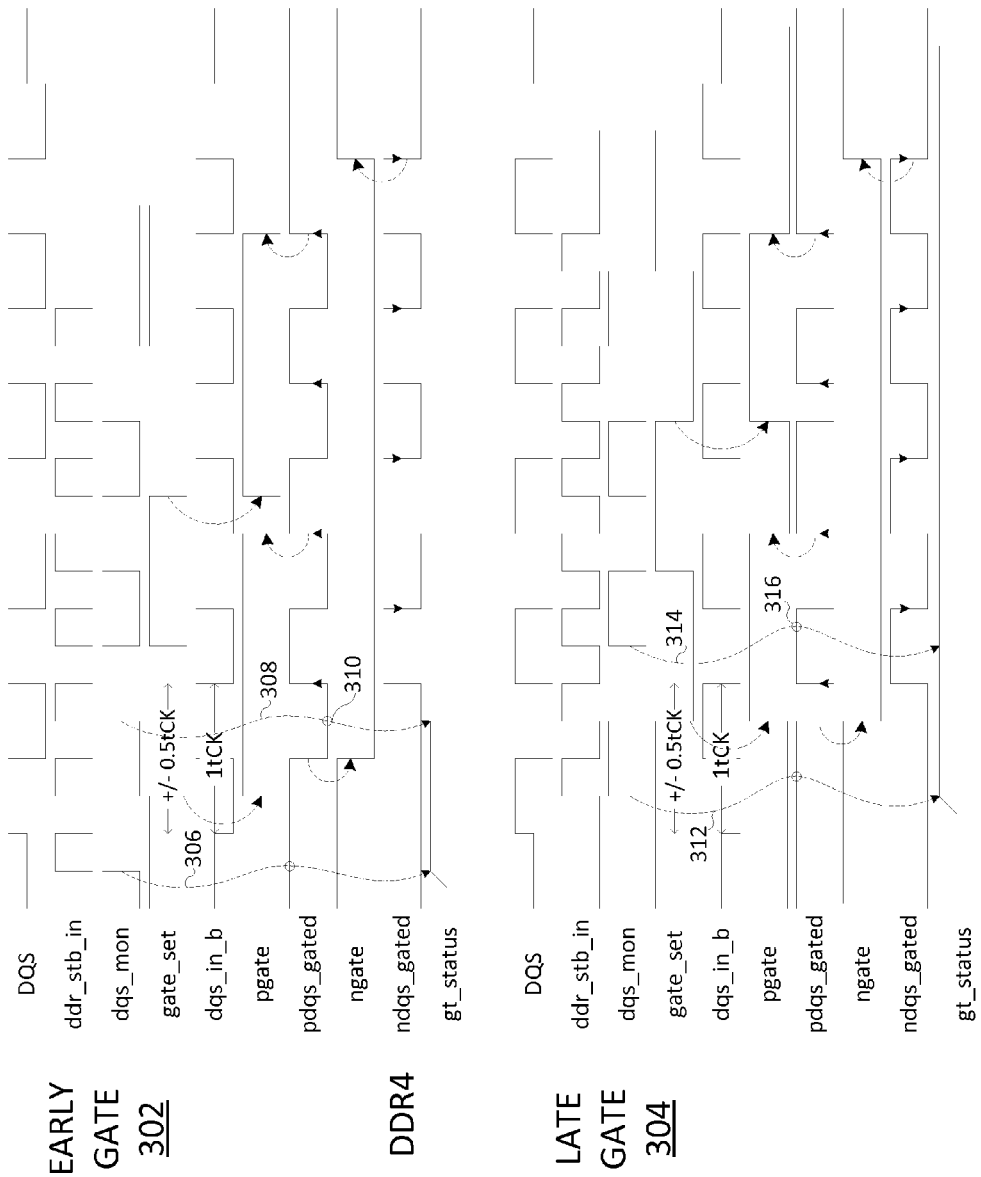
FIG. 3 illustrates a timing diagram for tracking the DQS signal over a period of time in a DDR4 SDRAM.

FIG. 3 illustrates an example timing diagram or waveform for an "early gate" 302 and a "late gate" 304 in a DDR4 SDRAM. While discussing FIG. 3, reference to the signals in FIG. 1 may be made concurrently with discussion of FIG. 3. As discussed above, the gating circuit 102 may be designed to continuously monitor a timing of the arrival of the DQS signal or strobe signal 132. For example, the pdqs_gated signal 134 may be sampled by the monitor flip flop 116 and compared to the dqs_mon signal 140 to determine if the relative arrival of the DQS signal 132 is early or late. Based on the determination, the strobe clock input signal 106 can be further delayed or the delay can be reduced by the programmable delay 144.

Referring to the waveforms for the early gate 302, the ddr_stb_in begins early relative to the DQS signal 132. When the dqs_mon signal 140 is set to a high value and the pdqs_gated signal 134 is set to a high value, the gt_status signal 138 also begins as a high value as illustrated by dashed line 306. However, at a later time as the dqs_mon signal 140 rises again, the rise occurs in the middle of a low period of the pdqs_gated signal 134 causing the gt_status signal to be set to a low value as illustrated by dashed line 308 and a circle 310 on the pdqs_gated signal 134. Thus, when the gt_status signal 138 is read as a low value or zero, the memory controller may know that the ddr_stb_in signal 106 begins early relative to the DQS signal 132 and, thus, may adjust the programmable delay 144 to add an additional delay to the strobe clock signal 150.

Referring to the waveforms for the late gate 304, the ddr_stb_in begins late relative to the DQS signal 132. When the dqs_mon signal 140 is set to a high value and the pdqs_gated signal 134 is set to a high value, the gt_status signal 138 also begins as a high value as illustrated by dashed line 312. However, at a later time as the dqs_mon signal 140 rises again, the rise occurs in the middle of a high period of the pdqs_gated signal 134 causing the gt_status signal to remain at a high value as illustrated by dashed line 314 and a circle 316 on the pdqs_gated signal 134. Thus, when the gt_status signal 138 is read as a high value or one, the memory controller may know that ddr_stb_in signal 106 begins late relative to the DQS signal 132 and, thus, adjust the programmable delay 144 to remove a delay to the strobe clock signal 150.

In one embodiment, the monitoring may be performed continuously over a period of time. Thus, the gt_status signal 138 may fluctuate between a low value and a high value and the programmable delay 144 may be adjusted accordingly as the gt_status signal 138 changes. For example, if ddr_stb_in begins early relative to the DQS signal 132, the programmable delay 144 may be incremented higher by the memory controller. The gating circuit 102 may be monitored again and if ddr_stb_in signal 106 is still early relative to the DQS signal 132, the programmable delay 144 may be adjusted again to add an additional delay by the memory controller. The gating circuit 102 may be monitored again and if the gating circuit 102 is now "late," the programmable delay 144 may be adjusted to decrement the delay lower, and so forth. The process may be repeated as the memory continues to run or operate. In one embodiment, the monitoring may end when the system is shut down or the memory is taken off-line.

Figure 4:
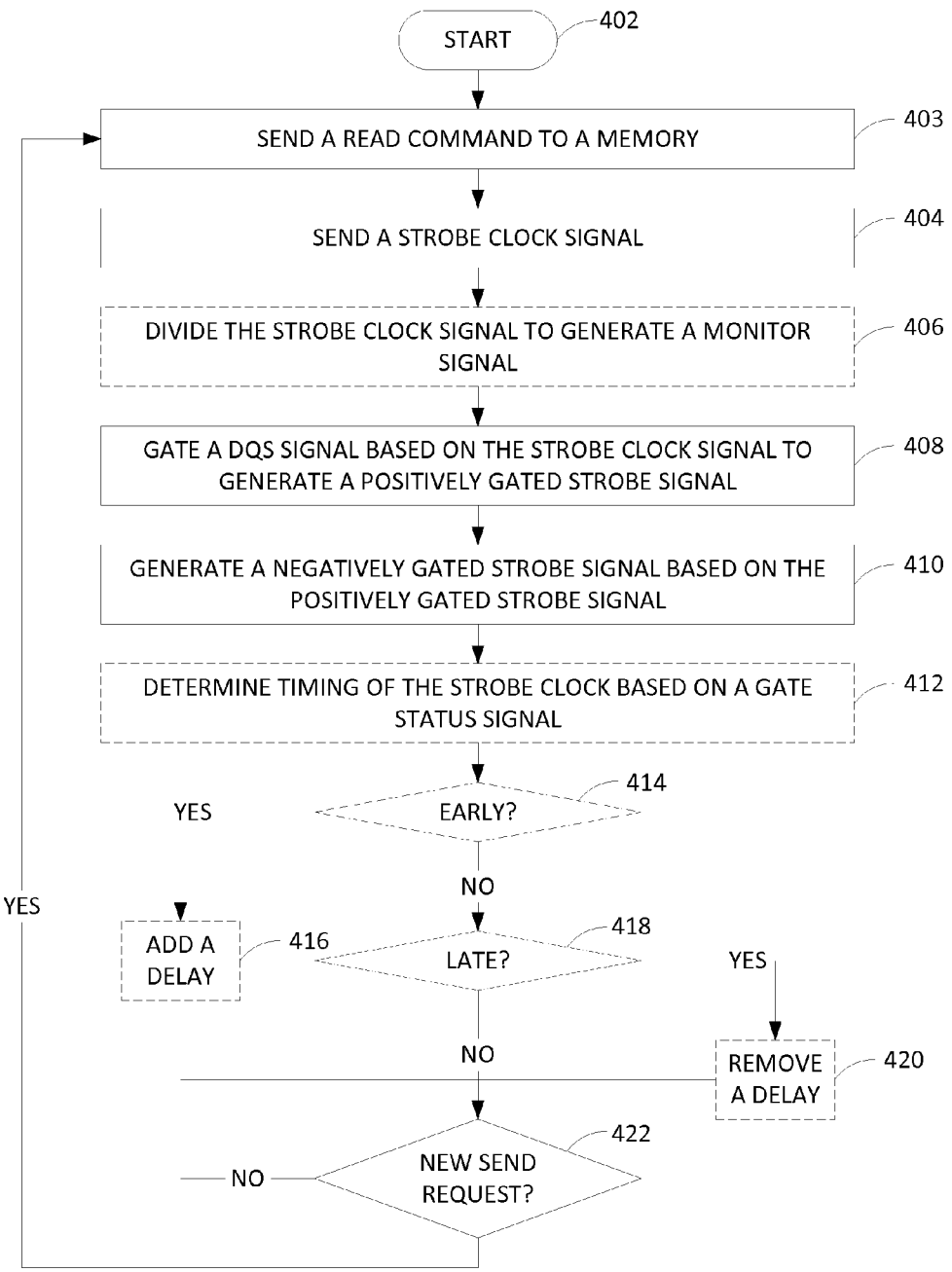
FIG. 4 illustrates an example flow chart of a method for gating a strobe (DQS) signal.
Figure 5:
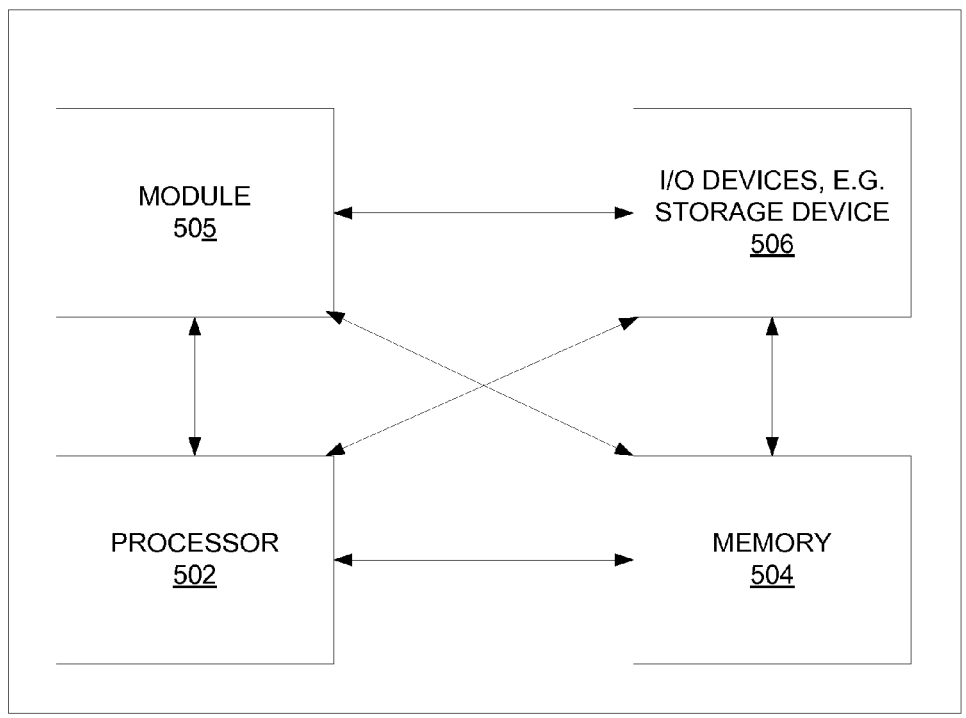
FIG. 5 illustrates a high-level block diagram of a general-purpose computer suitable for use in performing the functions described herein.

FIG. 4 illustrates a flowchart of a method 400 for gating a DQS signal. In one embodiment, the method 400 may be performed by a circuit as illustrated in FIG. 1 or a memory controller of a memory (e.g., a DDR3 SDRAM or DDR4 SDRAM) or (or any other hardware equivalent device) as illustrated in FIG. 5, and discussed below.

The method 400 begins at step 402. At step 403, a read command (e.g., READ CMD) is sent to a memory. After the read command is sent, a read strobe signal (e.g., READ DQS signal or simply DQS signal) is returned from the memory.

At step 404, the method 400 sends a strobe clock signal. For example, in response to the expected return of the READ DQS signal, the strobe clock signal may be sent to the gating circuit after the read command is issued, but before the DQS signal is returned from the memory. In one embodiment, the strobe clock signal may be sent to the gating circuit for a duration of the DQS signal. In one embodiment, based on prior training to position the strobe clock signal relative to the DQS signal, the strobe clock signal may be sent such that it is ideally positioned relative to the DQS signal to open the pgate in the center of the pre-amble of the DQS signal as discussed above.

At optional step 406, the strobe clock signal may be divided by a first divider circuit to generate a monitor signal. The monitor signal may be used to generate a gate status signal that is used to monitor the timing of the gating circuit. In other words, the DQS signal may be gated and the gated DQS signal may be sampled and compared to the gate status signal to determine if the strobe clock signal is early or late relative to the DQS signal.

At step 408, the method 400 gates the DQS signal based on the strobe clock signal to generate a positively gated strobe signal. The positively gated strobe signal may track the DQS signal such that the rising edges of the DQS signal may be used to read data in the memory. In one embodiment, the gating is performed during a pre-amble of the memory. Notably, the method 400 may perform gating properly during the pre-amble whether the pre-amble is for DDR3 SDRAM or DDR4 SDRAM.

For example, DDR4 has a falling edge in the pre-amble due to a low period that is half of a memory clock period. Previous methods would have difficulty in gating the DDR4 during the half memory clock period. The embodiments of the present disclosure allow the gating to occur in the middle of the DDR3 pre-amble that is one memory clock period long or during the falling edge of the DDR4 pre-amble.

At step 410, the method 400 generates a negatively gated strobe signal based on the positively gated strobe signal. As discussed above, the gating circuit may be designed such that a single signal is used to generate separately the positively gated strobe signal for indicating a rising edge of the DQS signal or for reading the DQS signal during a rising edge and a negatively gated strobe signal indicating a falling edge of the DQS signal or for reading the DQS signal during a falling edge. As a result, timing issues for the gating of both gated signals are minimized.

In addition, the gating circuit is designed such that the first falling edge of the negatively gated strobe signal is properly read after the pre-amble. In other words, the embodiments of the present disclosure avoid accidentally reading a falling edge that occurs during the pre-amble.

Furthermore, the gating circuit is designed such that the negatively gated strobe signal automatically closes the gating circuit behind itself after the last falling edge of the negatively gated strobe has occurred. As a result, timing issues experienced by prior designs due to turning on and off the gating circuit manually are avoided.

At optional step 412, the method 400 determines a timing of the strobe clock signal based on the status signal. As discussed above, the status signal may be generated by comparing the sampled gated DQS signal to the strobe clock signal to determine whether the strobe clock signal is early or late relative to the pre-amble of the DQS signal.

At optional step 414, the method 400 determines if the strobe clock signal is early. For example, the strobe clock signal may be determined to be early if the gate status signal output from the monitor flip flop is low or zero. If the strobe clock signal is early, then the method 400 may proceed to optional step 416.

At optional step 416, the method 400 may add a delay. For example, the memory controller may increase a programmable delay of the strobe clock signal before the strobe clock signal enters the gating circuit. The method 400 may then proceed to optional step 422.

Referring back to optional step 414, if the method 400 determines that the strobe clock signal is not early, then the method 400 proceeds to optional step 418. At optional step 418, the method 400 determines if the strobe clock signal is late. For example, the strobe clock signal may be determined to be late if the gate status signal output from the monitor flip flop is high or one. If the strobe clock signal is late, then the method 400 may proceed to optional step 420.

At optional step 420, the method 400 may remove a delay. For example, the memory controller may decrease a programmable delay of the strobe clock signal. In other words, removing a delay does not necessarily mean removing all of the delay, but rather some or a portion of the overall delay. The method 400 may then proceed to optional step 422.

In one embodiment, the timing of the strobe clock signal relative to the pre-amble of the DQS signal may be a continuous and iterative process to monitor for drift. For example, the memory controller may continually add or remove delay to adjust for any VT variation over time as the memory continues to operate.

At step 422, the method 400 determines if a new read request is received. If no new read request is received, the method 400 may continue to wait for a new read request to arrive. However, if a new read request is received, the method 400 may return to step 403. For example, the system may wait for another read command to be sent to the memory.

It should be noted that although not explicitly specified, one or more steps, blocks, or functions of the method 400 described above may include a storing, displaying and/or outputting step as required for a particular application. In other words, any data, records, fields, and/or intermediate results discussed in the methods can be stored, displayed, and/or outputted to another device as required for a particular application. Furthermore, steps, blocks, or functions in FIG. 4 that recite a determining operation, or involve a decision, do not necessarily require that both branches of the determining operation be practiced. In other words, one of the branches of the determining operation can be deemed as an optional step.

FIG. 5 depicts a high-level block diagram of a general-purpose computer or system suitable for use in performing the functions described herein. As depicted in FIG. 5, the system 500 comprises a hardware processor element (e.g., a CPU) or a hardware memory controller 502, a memory 504, e.g., random access memory (RAM) and/or read only memory (ROM), a module 505 for gating a DQS signal and various input/output devices 506, e.g., any type of storage device, an output port, an input port and any number of interfaces.

It should be noted that the present disclosure can be implemented in software and/or in a combination of software and hardware, e.g., using application specific integrated circuits (ASIC), a general purpose computer or any other hardware equivalents, e.g., computer readable instructions pertaining to the method(s) discussed above can be used to configure a hardware processor to perform the steps or functions of the above disclosed method. In one embodiment, the present module or process 505 for gating a DQS signal can be loaded into memory 504 and executed by hardware processor/controller 502 to implement the functions as discussed above. As such, the present process 505 for gating a DQS signal as discussed above in method 400 (including associated data structures) of the present disclosure can be stored on a non-transitory (e.g., tangible or physical) computer readable storage medium, e.g., RAM memory, magnetic or optical drive or diskette and the like.

While the foregoing describes exemplary embodiments in accordance with one or more aspects of the present disclosure, other and further embodiments in accordance with the one or more aspects of the present disclosure may be devised without departing from the scope thereof, which is determined by the claims that follow and equivalents thereof. Claims listing steps do not imply any order of the steps. Trademarks are the property of their respective owners.

What is claimed is:

1. A method for gating a strobe (DQS) signal, comprising:
 sending, by a memory controller, a read command to a memory;
 sending, by the memory controller, a strobe clock signal after the read command is sent and before the DQS signal is received from the memory, wherein the strobe clock signal comprises a duration equal to a duration of the DQS signal;
 gating, by the memory controller, the DQS signal based on the strobe clock signal to generate a positively gated strobe signal indicating a rising edge of the DQS signal, wherein the gating is performed during a pre-amble of the DQS signal; and
 generating, by the memory controller, a negatively gated strobe signal based on the positively gated strobe signal indicating a falling edge of the DQS signal.

2. The method of claim 1, further comprising:
 dividing, by the memory controller, the strobe clock signal to generate a monitor signal that is compared to the positively gated strobe signal to generate a gate status signal.

3. The method of claim 2, further comprising:
 determining, by the memory controller, the strobe clock signal is early based on the gate status signal; and
 adding, by the memory controller, a delay to the strobe clock signal to ensure that the DQS signal is gated during a pre-amble of the DQS signal.

4. The method of claim 2, further comprising:
 determining, by the memory controller, the strobe clock signal is late based on the gate status signal; and
 removing, by the memory controller, a delay to the strobe clock signal to ensure that the DQS signal is gated during a pre-amble of the DQS signal.

5. The method of claim 1, further comprising:
 stopping, by the memory controller, the gating of the DQS signal using the positively gated strobe signal when the DQS signal is completed.

6. The method of claim 1, wherein the DQS signal is a read data strobe signal of a synchronous dynamic random access memory (SDRAM).

7. The method of claim 6, wherein a pre-amble of the DQS signal comprises one memory clock period of a DDR3 SDRAM.

8. The method of claim 6, wherein a pre-amble of the DQS signal comprises a high to low transition in a memory clock period of a DDR4 SDRAM.

9. A non-transitory computer-readable medium storing a plurality of instructions which, when executed by a memory controller, cause the memory controller to perform operations for gating a strobe (DQS) signal, the operations comprising:
    sending a read command to a memory;
    sending a strobe clock signal after the read command is sent and before the DQS signal is received from the memory, wherein the strobe clock signal comprises a duration equal to a duration of the DQS signal;
    gating the DQS signal based on the strobe clock signal to generate a positively gated strobe signal indicating a rising edge of the DQS signal, wherein the gating is performed during a pre-amble of the DQS signal; and
    generating a negatively gated strobe signal based on the positively gated strobe signal indicating a falling edge of the DQS signal.

10. The non-transitory computer-readable medium of claim 9, further comprising:
    dividing the strobe clock signal to generate a monitor signal that is compared to the positively gated strobe signal to generate a gate status signal.

11. The non-transitory computer-readable medium of claim 10, further comprising:
    determining the strobe clock signal is early based on the gate status signal; and
    adding a delay to the strobe clock signal to ensure that the DQS signal is gated during a pre-amble of the DQS signal.

12. The non-transitory computer-readable medium of claim 10, further comprising:
    determining the strobe clock signal is late based on the gate status signal; and
    removing a delay to the strobe clock signal to ensure that the DQS signal is gated during a pre-amble of the DQS signal.

13. The non-transitory computer-readable medium of claim 9, further comprising:
    stopping the gating of the DQS signal using the positively gated strobe signal when the DQS signal is completed.

14. The non-transitory computer-readable medium of claim 9, wherein the DQS signal is a read data strobe signal of a synchronous dynamic random access memory (SDRAM).

15. The non-transitory computer-readable medium of claim 14, wherein a pre-amble of the DQS signal comprises one memory clock period of a DDR3 SDRAM.

16. The non-transitory computer-readable medium of claim 14, wherein a pre-amble of the DQS signal comprises a high to low transition in a memory clock period of a DDR4 SDRAM.

17. A circuit for gating a strobe (DQS) signal, comprising:
    a clock generator circuit for sending a strobe clock signal; and
    a gating circuit, coupled to the clock generator circuit, the gating circuit comprising:
        a pgate circuit for gating the DQS signal based on the strobe clock signal to generate a positively gated strobe signal indicating a rising edge of the DQS signal, wherein the gating is performed during a pre-amble of the DQS signal; and
        an ngate circuit for generating a negatively gated strobe signal based on the positively gated strobe signal indicating a falling edge of the DQS signal.

18. The circuit of claim 17, wherein the pgate circuit comprises:
    a pgate flip flop for receiving a gate set signal to generate a pgate signal; and
    a NAND gate for receiving the pgate signal and an inverted version of the DQS signal to generate the positively gated strobe signal.

19. The circuit of claim 17, wherein the ngate circuit comprises:
    an ngate flip flop for receiving the positively gated strobe signal to generate an ngate signal; and
    a NOR gate for receiving an inverted version of the DQS signal and the ngate signal to generate the negatively gated strobe signal.

20. The circuit of claim 17, where the gating circuit further comprises:
    a gate monitor circuit coupled to the pgate circuit for generating a gate status signal that indicates that the strobe clock signal is either early, on time or late.

* * * * *